US011882721B2

(12) United States Patent
Fan et al.

(10) Patent No.: US 11,882,721 B2
(45) Date of Patent: Jan. 23, 2024

(54) DISPLAY PANEL AND DISPLAY DEVICE COMPRISING INORGANIC PACKAGING LAYER HAVING MULTIPLE INORGANIC SUBLAYERS

(71) Applicant: BOE TECHNOLOGY GROUP CO., LTD., Beijing (CN)

(72) Inventors: Xing Fan, Beijing (CN); Hao Gao, Beijing (CN); Qixiao Wu, Beijing (CN); Cheng Han, Beijing (CN); Tao Wang, Beijing (CN); Yansong Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 245 days.

(21) Appl. No.: 17/483,253

(22) Filed: Sep. 23, 2021

(65) Prior Publication Data
US 2022/0310969 A1    Sep. 29, 2022

(30) Foreign Application Priority Data
Mar. 25, 2021    (CN) .......................... 202110322210.2

(51) Int. Cl.
*H10K 50/844*    (2023.01)
*H10K 50/85*    (2023.01)

(52) U.S. Cl.
CPC .......... *H10K 50/844* (2023.02); *H10K 50/85* (2023.02)

(58) Field of Classification Search
None
See application file for complete search history.

(56) References Cited

U.S. PATENT DOCUMENTS

| 2020/0185640 | A1 | 6/2020 | Gao | |
|---|---|---|---|---|
| 2021/0359274 | A1* | 11/2021 | Kim | H10K 50/844 |
| 2022/0140290 | A1* | 5/2022 | Choi | H10K 50/858 |
| | | | | 257/40 |

FOREIGN PATENT DOCUMENTS

CN    208889704 U    5/2019

\* cited by examiner

*Primary Examiner* — Daniel Whalen
(74) *Attorney, Agent, or Firm* — WOMBLE BOND DICKINSON (US) LLP

(57) ABSTRACT

The present disclosure provides a display panel and a display device. The display panel includes: a substrate; and a light-emitting device and a packaging structure on the substrate, the packaging structure sealing the light-emitting device on the substrate. The light-emitting device includes a cathode, an anode, and a light-emitting layer between the cathode and the anode; the packaging structure includes a first inorganic packaging layer, and the first inorganic packaging layer includes a first inorganic packaging sublayer, a second inorganic packaging sublayer, and a third inorganic packaging sublayer that are sequentially stacked; and a refractive index of the second inorganic packaging sublayer is greater than a refractive index of the first inorganic packaging sublayer, and a difference between the refractive index of the second inorganic packaging sublayer and the refractive index of the first inorganic packaging sublayer is greater than 0.1, the refractive index of the second inorganic packaging sublayer is greater than a refractive index of the third inorganic packaging sublayer, and a difference between the refractive index of the second inorganic packaging sublayer and the refractive index of the third inorganic packaging sublayer is greater than 0.1.

12 Claims, 4 Drawing Sheets

DISPLAY PANEL AND DISPLAY DEVICE COMPRISING INORGANIC PACKAGING LAYER HAVING MULTIPLE INORGANIC SUBLAYERS

RELATED APPLICATION

The present application claims the benefit of Chinese Patent Application No. 20211032210.2, filed on Mar. 25, 2021, the entire disclosure of which is incorporated herein by reference.

TECHNICAL FIELD

The present disclosure relates to the display technology, in particular to a display panel and a display device.

BACKGROUND

With the continuous development of technology, display panels are more and more widely used in various fields. Flexible display panels are gradually replacing rigid display panels because of their bendable characteristics. The display panel needs to package the light-emitting device, and for the flexible display panel, it is necessary to change from the conventional rigid package based on glass packaging to the flexible package based on thin film packaging.

SUMMARY

According to an aspect of the present disclosure, a display panel is provided. The display panel includes: a substrate; and a light-emitting device and a packaging structure on the substrate, the packaging structure sealing the light-emitting device on the substrate. The light-emitting device includes a cathode, an anode, and a light-emitting layer between the cathode and the anode; the packaging structure includes a first inorganic packaging layer, and the first inorganic packaging layer includes a first inorganic packaging sublayer, a second inorganic packaging sublayer, and a third inorganic packaging sublayer that are sequentially stacked; and a refractive index of the second inorganic packaging sublayer is greater than a refractive index of the first inorganic packaging sublayer, and a difference between the refractive index of the second inorganic packaging sublayer and the refractive index of the first inorganic packaging sublayer is greater than 0.1, the refractive index of the second inorganic packaging sublayer is greater than a refractive index of the third inorganic packaging sublayer, and a difference between the refractive index of the second inorganic packaging sublayer and the refractive index of the third inorganic packaging sublayer is greater than 0.1.

In some embodiments, the packaging structure further includes an organic packaging layer and a second inorganic packaging layer that are stacked, and the organic packaging layer is between the first inorganic packaging layer and the second inorganic packaging layer.

In some embodiments, the difference between the refractive index of the second inorganic packaging sublayer and the refractive index of the first inorganic packaging sublayer is greater than 0.6 and less than 1.5, and the difference between the refractive index of the second inorganic packaging sublayer and the refractive index of the third inorganic packaging sublayer is greater than 0.3 and less than 1.5.

In some embodiments, the difference between the refractive index of the second inorganic packaging sublayer and the refractive index of the first inorganic packaging sublayer is greater than 0.9, and the difference between the refractive index of the second inorganic packaging sublayer and the refractive index of the third inorganic packaging sublayer is greater than 0.6.

In some embodiments, the difference between the refractive index of the second inorganic packaging sublayer and the refractive index of the first inorganic packaging sublayer is greater than the difference between the refractive index of the second inorganic packaging sublayer and the refractive index of the third inorganic packaging sublayer.

In some embodiments, a thickness of the third inorganic packaging sublayer is greater than 5 times a thickness of the first inorganic packaging sublayer and greater than 3.3 times a thickness of the second inorganic packaging sublayer.

In some embodiments, a thickness of the third inorganic packaging sublayer is greater than 25 times a thickness of the first inorganic packaging sublayer and greater than 25 times a thickness of the second inorganic packaging sublayer.

In some embodiments, the first inorganic packaging sublayer has a refractive index of 1-1.6 and a thickness of 40-200 nm; the second inorganic packaging sublayer has a refractive index of 1.6-2.5, and a thickness of 40-300 nm; the third inorganic packaging sublayer has a refractive index of 1-2.2, and a thickness greater than or equal to 1000 nm; and materials forming the first inorganic packaging sublayer, the second inorganic packaging sublayer and the third inorganic packaging sublayer are independently selected from $SiO_2$, SiN, silicon oxynitride, $Al_2O_3$ or ZrO.

In some embodiments, the display panel further includes a light extraction layer between the light-emitting device and the packaging structure, and a refractive index of the light extraction layer is greater than the refractive index of the first inorganic packaging sublayer, and a difference between the refractive index of the light extraction layer and the refractive index of the first inorganic packaging sublayer is greater than 0.2.

In some embodiments, the difference between the refractive index of the light extraction layer and the refractive index of the first inorganic packaging sublayer is greater than 0.8.

In some embodiments, the light extraction layer is on a side of the cathode away from the light emitting layer; the refractive index of the light extraction layer is greater than 1.8, and a thickness of the light extraction layer is less than 150 nm.

In some embodiments, the first inorganic packaging layer further includes a fourth inorganic packaging sublayer, the fourth inorganic packaging sublayer is between the third inorganic packaging sublayer and the organic packaging layer; and the refractive index of the third inorganic packaging sublayer is greater than a refractive index of the fourth inorganic packaging sublayer, and a difference between the refractive index of the third inorganic packaging sublayer and the refractive index of the fourth inorganic packaging sublayer is greater than 0.1, the refractive index of the fourth inorganic packaging sublayer is greater than a refractive index of the organic packaging layer, and a difference between the refractive index of the fourth inorganic packaging sublayer and the refractive index of the organic packaging layer is greater than 0.1.

According to another aspect of the present disclosure, a display device is provided. The display device includes the display panel described in any of the foregoing embodiments.

DETAILED DESCRIPTION OF THE DISCLOSURE

The embodiments of the present disclosure are described in detail below. The embodiments described below are exemplary, and are only used to explain the present disclosure, and should not be construed as limiting the present disclosure. Where specific techniques or conditions are not indicated in the embodiments, the procedures shall be carried out in accordance with the techniques or conditions described in the literature in the art or in accordance with the product specification. If the manufacturer is not indicated for the reagents used, they are all conventional products that can be purchased on the market.

For flexible display panels, it is necessary to change from the conventional rigid packaging based on glass packaging to flexible packaging based on thin film packaging. Due to the difference between the two packaging structures, the light output efficiency of the light-emitting device in the flexible display panel will decrease by about 20%. At present, the main improvement method is to add a layer of lithium fluoride between the light-emitting device and the packaging structure to improve the light-emitting characteristics of the light-emitting device. However, researchers have found that the lithium fluoride layer easily causes problems such as peeling of the film and crystallization of the vapor deposition cavity, resulting in lower production efficiency and higher production costs.

In the related art, the packaging structure is to arrange a plurality of alternating inorganic film layers and organic film layers above the light-emitting device to prevent water and oxygen from entering the inside of the light-emitting device to prolong the service life of the light-emitting device. Researchers have found that when an inorganic film layer close to a light-emitting device is set as multiple stacked inorganic film layers with specific refractive indexes, the multiple stacked inorganic film layers can cooperate with each other to effectively improve the light-emitting characteristics of the device and enhance the luminous efficiency.

Figure 1:
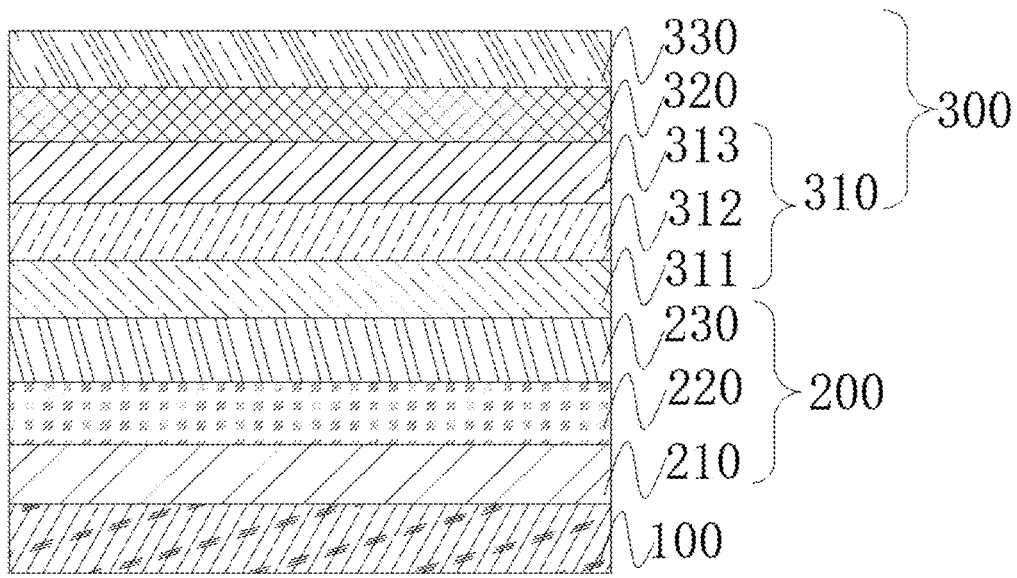
FIG. 1 is a schematic structural diagram of a display panel according to an embodiment of the present disclosure.

The present disclosure provides a display panel. Referring to FIG. 1, the display panel includes a substrate 100, and a light-emitting device 200 and a packaging structure 300 on the substrate 100, and the packaging structure 300 seals the light-emitting device 200 on the substrate 100. The light-emitting device 200 includes a cathode 230, an anode 210, and a light emitting layer 220 between the cathode 230 and the anode 210. The packaging structure 300 includes a first inorganic packaging layer 310, an organic packaging layer 320, and a second inorganic packaging layer 330. The first inorganic packaging layer 310 includes a first inorganic packaging sublayer 311, a second inorganic packaging sublayer 312, and a third inorganic packaging sublayer 313, which are sequentially stacked. A refractive index of the second inorganic packaging sublayer 312 is greater than A refractive index of the first inorganic packaging sublayer 311, and a difference between the refractive index of the second inorganic packaging sublayer 312 and the refractive index of the first inorganic packaging sublayer 311 is greater than 0.1. The refractive index of the second inorganic packaging sublayer 312 is greater than a refractive index of the third inorganic packaging sublayer 313, and a difference between the refractive index of the second inorganic packaging sublayer 312 and the refractive index of the third inorganic packaging sublayer 313 is greater than 0.1. The light-emitting device in the display panel has a microcavity effect. Researchers have found that if the difference between the refractive indexes is less than 0.1, the microcavity effect cannot be significantly enhanced. When the difference in refractive index is greater than 0.1, the microcavity effect can be significantly enhanced, thereby improving the luminous efficiency. And the larger the difference between the refractive indexes is, the better the improvement on luminous efficiency is. Therefore, the first inorganic packaging sublayer 311, the second inorganic packaging sublayer 312, and the third inorganic packaging sublayer 313 cooperate with each other to enhance the reflection at the interface, so that the light exit from the microcavity can be fed back into the microcavity, a stronger microcavity strengthening effect is generated to increase the luminous intensity of the resonant wavelength, thereby improving the luminous efficiency of the display panel. Meanwhile, the first inorganic packaging layer 310, the organic packaging layer 320, and the second inorganic packaging layer 330 can provide multiple protections to the light-emitting device 200, prevent water and oxygen from entering the light-emitting device 200, and further improve the service life of the display panel. The present disclosure effectively improves the luminous efficiency and reduces the power consumption without using the lithium fluoride layer, and also has the advantages of high production efficiency and low production cost.

It should be noted here that the first inorganic packaging layer 310 may include at least three sublayer structures stacked in sequence, and in a direction from a side of the first inorganic packaging layer 310 facing the substrate toward a side of the first inorganic packaging layer 310 away from the substrate, only the refractive index of the first three sublayers needs to meet the aforementioned requirements. The number of sublayers included in the first inorganic packaging layer 310 can be greater than or equal to three. Those skilled in the art can adjust the specific structure of the first inorganic packaging layer 310 and other parts of the packaging structure according to the requirements of the actual display panel on the premise of meeting the aforementioned requirements.

According to an embodiment of the present disclosure, the difference between the refractive index of the second inorganic packaging sublayer 312 and the refractive index of the first inorganic packaging sublayer 311 is greater than 0.6 and less than 1.5, and the difference between the refractive index of the second inorganic packaging sublayer 312 and the refractive index of the third inorganic packaging sublayer 313 is greater than 0.3 and less than 1.5. As a result, the luminous efficiency can be further improved.

According to an embodiment of the present disclosure, the difference between the refractive index of the second inorganic packaging sublayer 312 and the refractive index of the first inorganic packaging sublayer 311 is greater than 0.9, and the difference between the refractive index of the second inorganic packaging sublayer 312 and the refractive index of the third inorganic packaging sublayer 313 is greater than 0.6. As a result, the luminous efficiency can be further improved.

According to an embodiment of the present disclosure, the difference between the refractive index of the second inorganic packaging sublayer 312 and the refractive index of the first inorganic packaging sublayer 311 is greater than the difference between the refractive index of the second inorganic packaging sublayer 312 and the refractive index of the third inorganic packaging sublayer 313. The layered structure closer to the cathode plays a more important role in the microcavity device. Therefore, the above structure can further enhance the microcavity effect and further improve the luminous efficiency.

According to an embodiment of the present disclosure, a thickness of the third inorganic packaging sublayer 313 is greater than 5 times a thickness of the first inorganic packaging sublayer 311, and the thickness of the third inorganic packaging sublayer 313 is greater than 3.3 times a thickness of the second inorganic packaging sublayer 312. Therefore, under the premise of ensuring the luminous efficiency, the light-emitting device can be better protected, and water and oxygen can be prevented from entering the inside of the light-emitting device.

According to an embodiment of the present disclosure, the thickness of the third inorganic packaging sublayer 313 is greater than 25 times the thickness of the first inorganic packaging sublayer 311, and the thickness of the third inorganic packaging sublayer 313 is greater than 25 times the thickness of the second inorganic packaging sublayer 312. Therefore, the light-emitting device can be better protected.

According to an embodiment of the present disclosure, the first inorganic packaging sublayer 311 has a refractive index of 1-1.6, and a thickness is 40-200 nm. The second inorganic packaging sublayer 312 has a refractive index of 1.6-2.5, and a thickness of 40-300 nm. The third inorganic packaging sublayer 313 has a refractive index of 1-2.2, and a thickness greater than or equal to 1000 nm. As a result, the luminous efficiency can be further improved, and the light-emitting device can be better protected.

According to an embodiment of the present disclosure, materials forming the first inorganic packaging sublayer 311, the second inorganic packaging sublayer 312, and the third inorganic packaging sublayer 313 are independently selected from $SiO_2$, SiN, silicon oxynitride, $Al_2O_3$ or ZrO. In some embodiments, for silicon oxynitride, taking the total weight of silicon oxynitride as a reference, the silicon content may be 62.08%, the nitrogen content may be 26.78%, and the oxygen content may be 11.14%.

Further, the refractive index of the SiO2 is 1.46-1.5. The refractive index of the SiN is 1.85~1.9. The refractive index of the silicon oxynitride is 1.75 to 1.8.

Further, when the material for forming the first inorganic packaging sublayer 311, the second inorganic packaging sublayer 312, and the third inorganic packaging sublayer 313 is selected from SiO2, SiN or silicon oxynitride, the N content in the material of the second inorganic packaging sublayer 312 is greater than the N content in the material of the first inorganic packaging sublayer 311, the N content in the material of the second inorganic packaging sublayer 312 is greater than the N content in the material of the third inorganic packaging sublayer 313.

Figure 2:
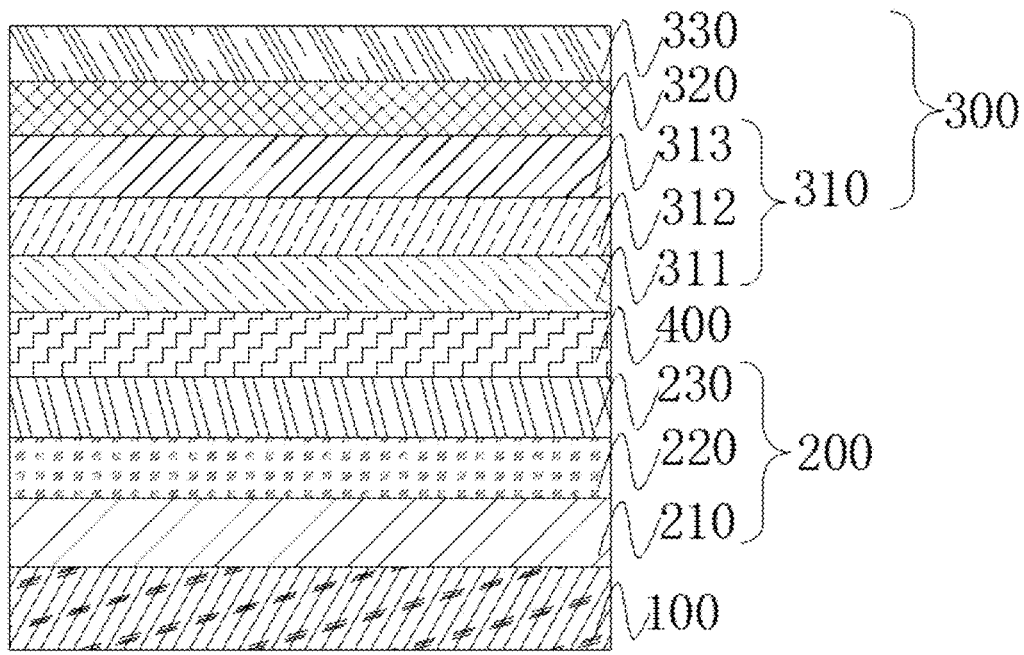
FIG. 2 is a schematic structural diagram of a display panel according to another embodiment of the present disclosure.

According to an embodiment of the present disclosure, referring to FIG. 2, the display panel further includes a light extraction layer 400 between the light-emitting device 200 and the packaging structure 300, and a refractive index of the light extraction layer 400 is greater than the refractive index of the first inorganic packaging sublayer 311, and the difference between the refractive index of the light extraction layer 400 and the refractive index of the first inorganic packaging sublayer 311 is greater than 0.2. The light extraction layer 400 can suppress the surface plasmon polariton (spp) effect on the surface of the cathode 230 of the light-emitting device 200, improve the efficiency of emitted light, and further improve the luminous efficiency.

According to an embodiment of the present disclosure, the difference between the refractive index of the light extraction layer 400 and the refractive index of the first inorganic packaging sublayer 311 is greater than 0.8. As a result, the luminous efficiency can be further improved.

According to an embodiment of the present disclosure, the light extraction layer 400 is on a side of the cathode 230 away from the light emitting layer 220, the refractive index of the light extraction layer 400 is greater than 1.8, and the thickness of the light extraction layer 400 is less than 150 nm. As a result, the luminous efficiency can be further improved.

Further, the first inorganic packaging sublayer 311 is between the light extraction layer 400 and the second inorganic packaging sublayer 312. Thus, the light extraction layer 400 cooperates with the first inorganic packaging sublayer 311, the second inorganic packaging sublayer 312, and the third inorganic packaging sublayer 313 disposed thereon, which can further improve the luminous efficiency.

In the present disclosure, a stacked structure with three sublayers meeting the aforementioned specific refractive index condition is arranged above the light extraction layer 400, so that the light exit from the microcavity can be reflected back into the microcavity after multiple reflection at the interfaces, a stronger microcavity effect is generated to increase the luminous intensity of the resonant wavelength, thereby improving the luminous efficiency of the display panel. Researchers have found that if a structure with one or two sublayers is placed above the light extraction layer 400, the microcavity effect is weaker than the microcavity effect of a structure with three sublayers, and the luminous efficiency is poor. Specifically, the microcavity device is composed of an anode and a cathode module, where the cathode module includes a cathode, a light extraction layer, and various layered structures for emitting light on the side of the light extraction layer away from the cathode. Among the various layered structures, the layered structure closer to the cathode plays a more important role in the module. In addition, the cathode module needs to consider a balance between reflectivity and transmittance. The greater the reflectivity, the more light is strengthened by resonance inside the microcavity, but the best light output efficiency can be obtained by balancing with the transmittance. The structure with three sublayers is in a more balanced microcavity position than the structure with two sublayers, thus the ratio of reflectance to transmittance is more reasonable, so the efficiency can be improved.

Figure 3:
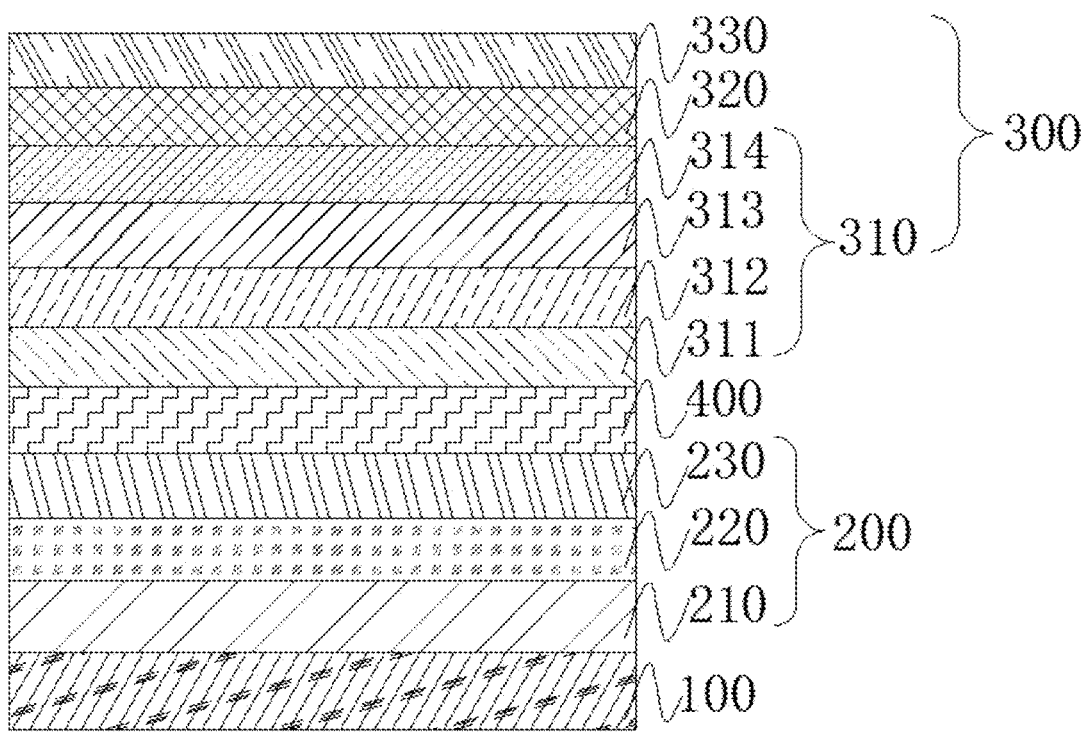
FIG. 3 is a schematic structural diagram of a display panel according to yet another embodiment of the present disclosure.

According to an embodiment of the present disclosure, referring to FIG. 3, the first inorganic packaging layer 310 may further include a fourth inorganic packaging sublayer 314, and the fourth inorganic packaging sublayer 314 is between the third inorganic packaging sublayer 313 and the organic packaging layer 320. As a result, the luminous efficiency can be further improved.

Further, the refractive index of the third inorganic packaging sublayer 313 is greater than a refractive index of the fourth inorganic packaging sublayer 314, and a difference between the refractive index of the third inorganic packaging sublayer 313 and the refractive index of the fourth inorganic packaging sublayer 314 is greater than 0.1. The refractive index of the fourth inorganic packaging sublayer 314 is greater than the refractive index of the organic packaging layer 320, and the difference between the refractive index of the fourth inorganic packaging sublayer 314 and the refractive index of the organic packaging layer 320 is greater than 0.1. As a result, the microcavity effect can be further enhanced, and the luminous efficiency can be improved.

Further, the material forming the fourth inorganic packaging sublayer may be $SiO_2$, SiN, silicon oxynitride, $Al_2O_3$ or ZrO.

Figure 6:
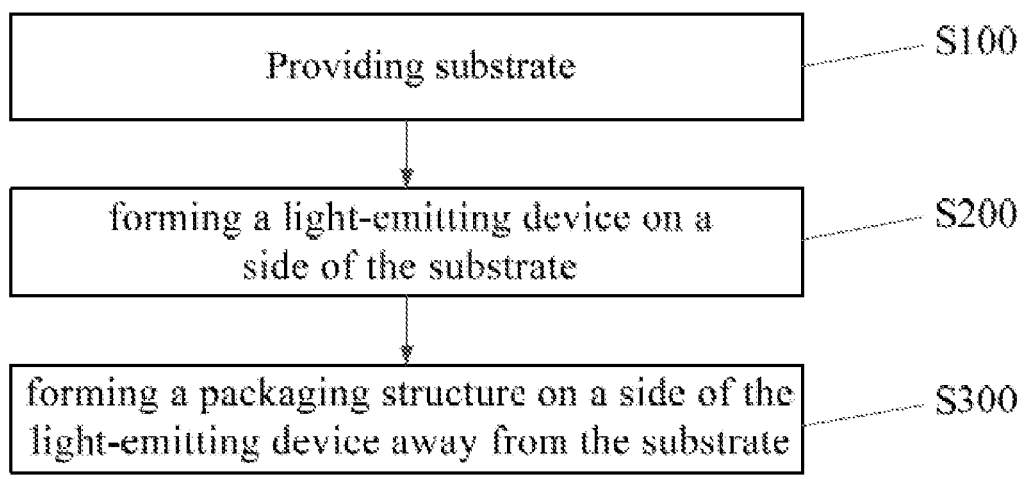
FIG. 6 is a flowchart of a manufacturing method of a display panel according to an embodiment of the present disclosure.

The present disclosure also provides a method for manufacturing a display panel. Referring to FIG. 6, the method includes:

S100, providing substrate

In this step, a substrate is provided. The present disclosure does not limit the material for forming the substrate, and the skilled person can make a selection according to the requirements of use.

S200, forming a light-emitting device on a side of the substrate

In this step, a light-emitting device is formed on a side of the substrate. Specifically, the light-emitting device includes an anode, a light-emitting layer, and a cathode that are stacked. The present disclosure does not limit the materials for forming the anode, the light-emitting layer, and the cathode, and the skilled person can make selections according to the requirements of use.

S300, forming a packaging structure on a side of the light-emitting device away from the substrate In this step, a packaging structure is formed on a side of the light-emitting device away from the substrate. The packaging structure includes a first inorganic packaging layer, an organic packaging layer, and a second inorganic packaging layer that are stacked, and the first inorganic packaging layer includes a first inorganic packaging sublayer, a second inorganic packaging sublayer, and a third inorganic packaging sublayer that are sequentially stacked. Further, the refractive index of the second inorganic packaging sublayer is greater than the refractive index of the first inorganic packaging sublayer, and the difference between the refractive index of the second inorganic packaging sublayer and the refractive index of the first inorganic packaging sublayer is greater than 0.1. The refractive index of the second inorganic packaging sublayer is greater than the refractive index of the third inorganic packaging sublayer, and the difference between the refractive index of the second inorganic packaging sublayer and the refractive index of the third inorganic packaging sublayer is greater than 0.1.

Therefore, the display panel manufactured by this method has all the features and advantages of the aforementioned display panel, and will not be repeated here.

Figure 7:
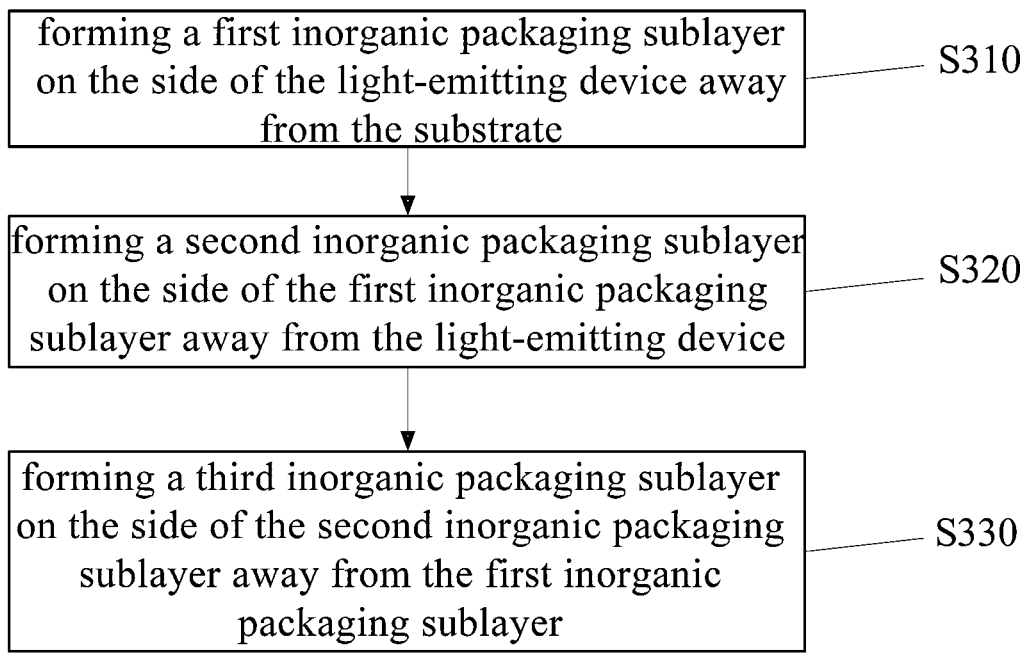
FIG. 7 is a flowchart of a manufacturing method of a display panel according to another embodiment of the present disclosure.

According to an embodiment of the present disclosure, referring to FIG. 7, forming a packaging structure on the side of the light-emitting device away from the substrate includes:

S310, forming a first inorganic packaging sublayer on the side of the light-emitting device away from the substrate In this step, a first inorganic packaging sublayer is formed on the side of the light-emitting device away from the substrate. In some embodiments, a light extraction layer is further provided on the side of the light-emitting device away from the substrate. Before forming the first inorganic packaging sublayer, the method further includes a step of forming a light extraction layer on the side of the light-emitting device away from the substrate, and subsequently, forming the first inorganic packaging sublayer on the side of the light extraction layer away from the light-emitting device.

S320. forming a second inorganic packaging sublayer on the side of the first inorganic packaging sublayer away from the light-emitting device In this step, a second inorganic packaging sublayer is formed on the side of the first inorganic packaging sublayer away from the light-emitting device. The second inorganic packaging sublayer is arranged on the side of the first inorganic packaging sublayer away from the light extraction layer.

S330, forming a third inorganic packaging sublayer on the side of the second inorganic packaging sublayer away from the first inorganic packaging sublayer In this step, a third inorganic packaging sublayer is formed on the side of the second inorganic packaging sublayer away from the first inorganic packaging sublayer. Thus, the first inorganic packaging sublayer, the second inorganic packaging sublayer, and the third inorganic packaging sublayer can be sequentially stacked on the side of the light-emitting device away from the substrate, which can effectively protect the light-emitting device and prevent water and oxygen from entering the inside of the light-emitting device. Further, the methods for forming the first inorganic packaging sublayer, the second inorganic packaging sublayer, and the third inorganic packaging sublayer may be the same or different, and are independently selected from chemical vapor deposition, atomic layer deposition or plasma enhanced chemical vapor deposition.

Further, after step S330, the method further includes: forming an organic packaging layer on the side of the third inorganic packaging sublayer away from the second inorganic packaging sublayer, and forming a second inorganic packaging layer on the side of the organic packaging layer away from the third inorganic packaging sublayer. Therefore, the organic packaging layer and the second inorganic packaging layer can better protect the light-emitting device, and prevent water and oxygen from entering the inside of the light-emitting device and affecting its service life.

Further, after step S330, the method may further include: forming a fourth inorganic packaging sublayer on the side of the third inorganic packaging sublayer away from the second inorganic packaging sublayer, and then forming an organic packaging layer on the side of the fourth inorganic packaging sublayer away from the third inorganic packaging sublayer and forming a second inorganic packaging layer on the side of the organic packaging layer away from the fourth inorganic packaging sublayer. Therefore, by providing the fourth inorganic packaging sublayer, the luminous efficiency can be further improved.

The skilled person can adjust the refractive index of silicon oxynitride according to requirements of use. Exemplarily, when the material for forming the first inorganic packaging sublayer, the second inorganic packaging sublayer or the third inorganic packaging sublayer is silicon oxynitride, the silicon oxynitride may be formed by a chemical vapor deposition method. Specifically, by adjusting the amount of intake air between the nitrogen source ($NH_3$, $N_2O$, $N_2$), oxygen source ($N_2O$), silicon source ($SiH_4$) and other gases ($H_2$, etc.), the ratio between nitrogen, oxygen and silicon in the formed silicon oxynitride can be adjusted, and thereby adjusting the refractive index of the formed silicon oxynitride.

The present disclosure also provides a display device, which includes the aforementioned display panel. It should be noted that the display device has all the features and advantages of the aforementioned display panel, which will not be repeated here. In general, the display device can effectively improve the luminous efficiency.

An example according to the present disclosure is exemplarily given below. A substrate 100 is provided, and a light-emitting device 200 is formed on a side of the substrate 100. The light-emitting device 200 includes an anode 210, a light emitting layer 220, and a cathode 230 that are stacked.

A light extraction layer 400 is formed on the side of the light-emitting device 200 away from the substrate 100, and then a first inorganic packaging sublayer 311 is formed on a side of the light extraction layer 400 away from the light-emitting device 200. The material forming the first inorganic packaging sublayer 311 is $SiO_2$, and the thickness of the first inorganic packaging sublayer 311 is 90 nm. A second inorganic packaging sublayer 312 is formed on a side of the first inorganic packaging sublayer 311 away from the light extraction layer 400. The material forming the second inorganic packaging sublayer 312 is SiN, and the thickness of the second inorganic packaging sublayer 312 is 60 nm. A third inorganic packaging sublayer 313 is formed on a side of the second inorganic packaging sublayer 312 away from the first inorganic packaging sublayer 311. The material forming the third inorganic packaging sublayer 313 is silicon oxynitride. Specifically, in silicon oxynitride, taking the total weight of silicon oxynitride as a reference, the silicon content may be 62.08%, the nitrogen content may be 26.78%, and the oxygen content may be 11.14%. The thickness of the third inorganic packaging sublayer 313 is about 1 μm. The methods for forming the first inorganic packaging sublayer 311, the second inorganic packaging sublayer 312, and the third inorganic packaging sublayer 313 are all chemical vapor deposition methods.

Figure 4:
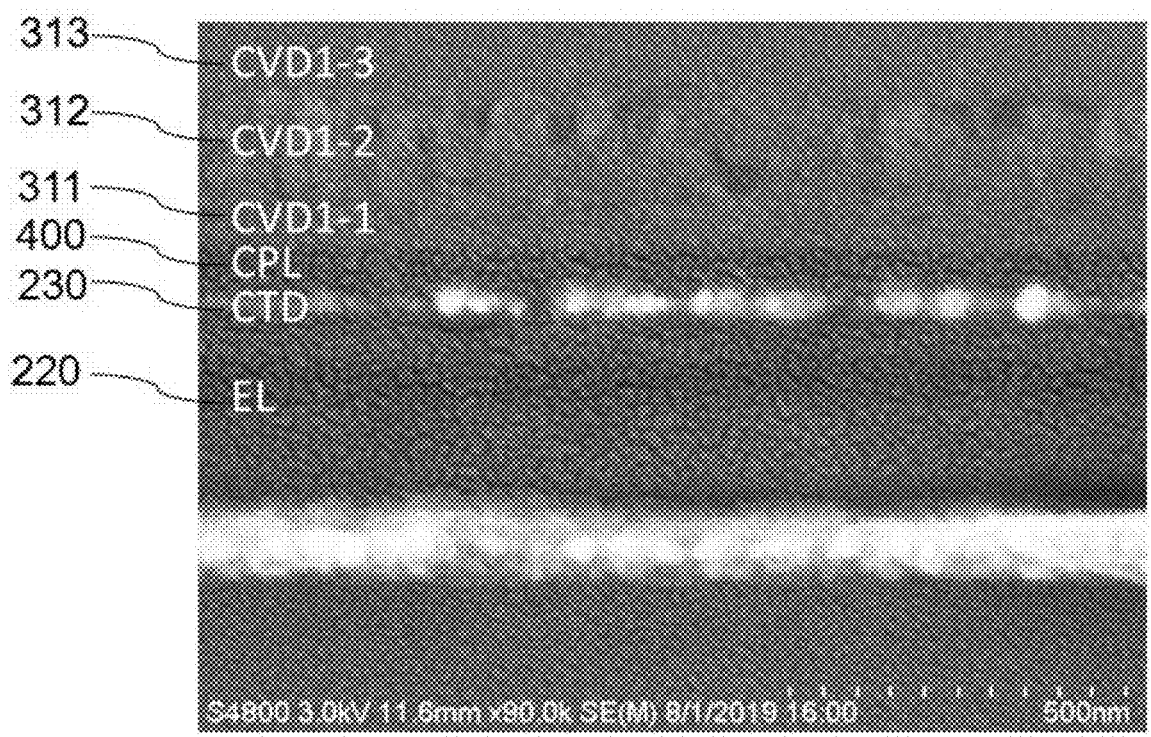
FIG. 4 is a scanning electron micrograph of a light-emitting device formed with a first inorganic packaging layer according to an embodiment of the present disclosure.

Referring to FIG. 4, it can be seen that a cathode 230, a light extraction layer 400, a first inorganic packaging sublayer 311, a second inorganic packaging sublayer 312, and a third inorganic packaging sublayer 313 are sequentially stacked above the light-emitting layer 220 (in FIG. 4, EL indicates the light-emitting layer 220, CTD indicates the cathode 230, CPL indicates the light extraction layer 400, CVD1-1 indicates the first inorganic packaging sublayer 311, CVD1-2 indicates the second inorganic packaging sublayer 312, and CVD1-3 indicates the third inorganic packaging sublayer 313).

Subsequently, an organic packaging layer 320 is formed on the side of the third inorganic packaging sublayer 313 away from the second inorganic packaging sublayer 312, and a second inorganic packaging layer 330 is formed on the side of the organic packaging layer 320 away from the third inorganic packaging sublayer 313, then the display panel is obtained, and the structure of the display panel is shown in FIG. 2. The methods for forming the organic packaging layer 320 and the second inorganic packaging layer 330 are both chemical vapor deposition methods.

Figure 5:
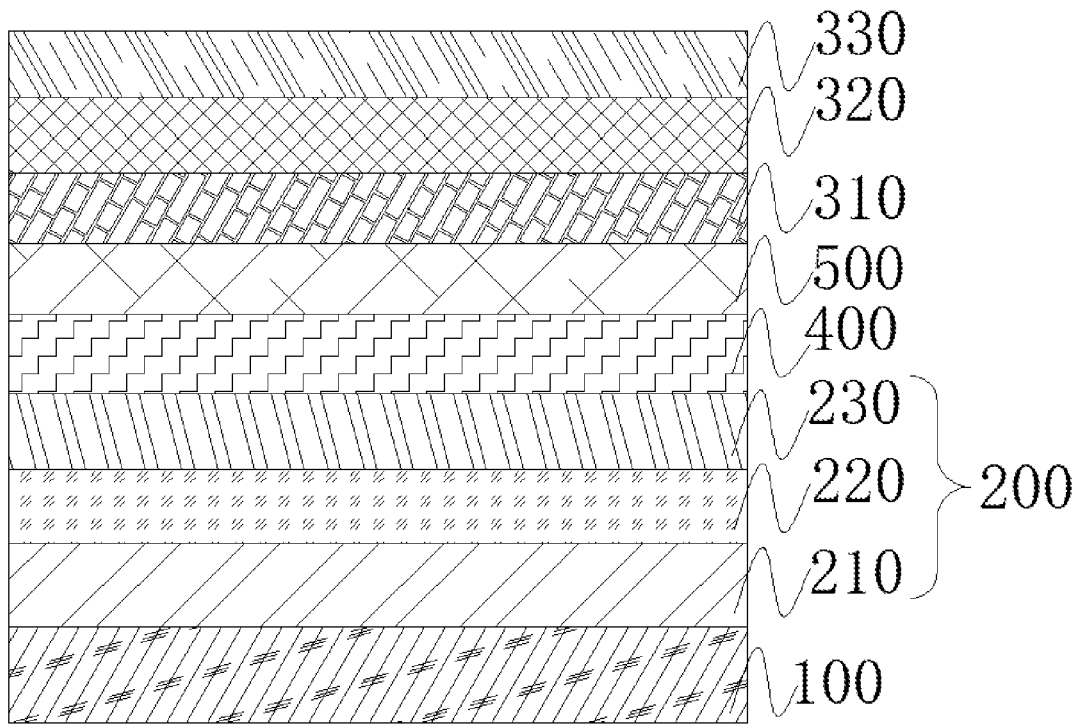
FIG. 5 is a schematic diagram of the structure of the display panel in the related art.

In an example of the related art, a lithium fluoride layer 500 is formed on the side of the light extraction layer 400 away from the substrate 100, and then the first inorganic packaging layer 310 is formed on the side of the lithium fluoride layer 500 away from the light extraction layer 400. The thickness of the first inorganic packaging layer 310 is about 1 μm. Subsequently, an organic packaging layer 320 and a second inorganic packaging layer 330 are formed on the side of the first inorganic packaging layer 310 away from the light extraction layer 400 to obtain a display panel. The structure of the display panel is shown in FIG. 5. The first inorganic packaging layer in the example of the related art is different from the first inorganic packaging layer in the embodiments of the present disclosure. Specifically, the first inorganic packaging layer in the example of the related art is composed of one-layer structure, while the first inorganic packaging layer in the embodiments of the present disclosure is composed of three-layer structure.

The luminous efficiency of the display panels prepared by an embodiment of the present disclosure and the example in related art are tested, and the test results are shown in Table 1 below.

TABLE 1

| | B | | G | | R | | W |
|---|---|---|---|---|---|---|---|
| | luminous efficiency | CIE-y | luminous efficiency | CIE-x | luminous efficiency | CIE-x | luminous efficiency |
| embodiment of the present disclosure | 102% | 0.051 | 107% | 0.264 | 105% | 0.685 | 106% |
| the example in related art | 100% | 0.048 | 100% | 0.253 | 100% | 0.681 | 100% |

B, G, R, W refer to blue light, green light, red light, and white light respectively, CIE-x refers to the x value of the color coordinate, and CIE-y refers to the y value of the color coordinate.

It can be seen from Table 1 that the color coordinates of the embodiment of the present disclosure and the example in related art are similar, so they can be compared. In addition, the luminous efficiency of blue light, green light, red light, and white light of the display panel of the embodiment of the present disclosure is significantly higher than that of the example in related art, indicating that the display panel of the present application can significantly improve the luminous efficiency compared with the display panel in related art.

Those skilled in the art can combine different examples and features of different examples described in this specification without confliction. In addition, it should be noted that in this specification, the terms "first", "second", "third", and "fourth" are only used for descriptive purposes, and cannot be understood as indicating or implying relative importance or implicitly indicating the number of technical features indicated.

Although the embodiments of the present application have been shown and described above, it can be understood that the above-mentioned embodiments are exemplary and should not be construed as limiting the present application.

A person of ordinary skill in the art can make changes, amendments, substitutions, and modifications on the foregoing within the scope of the present application.

What is claimed is:

1. A display panel, comprising:
   a substrate; and
   a light-emitting device and a packaging structure on the substrate, the packaging structure sealing the light-emitting device on the substrate;
   wherein the light-emitting device comprises a cathode, an anode, and a light-emitting layer between the cathode and the anode;
   the packaging structure comprises a first inorganic packaging layer, and the first inorganic packaging layer comprises a first inorganic packaging sublayer, a second inorganic packaging sublayer, and a third inorganic packaging sublayer that are sequentially stacked; and
   a refractive index of the second inorganic packaging sublayer is greater than a refractive index of the first inorganic packaging sublayer, and a difference between the refractive index of the second inorganic packaging sublayer and the refractive index of the first inorganic packaging sublayer is greater than 0.1, the refractive index of the second inorganic packaging sublayer is greater than a refractive index of the third inorganic packaging sublayer, and a difference between the refractive index of the second inorganic packaging sublayer and the refractive index of the third inorganic packaging sublayer is greater than 0.1,
   wherein a thickness of the third inorganic packaging sublayer is greater than 5 times a thickness of the first inorganic packaging sublayer and greater than 3.3 times a thickness of the second inorganic packaging sublayer,
   wherein the display panel further comprises a light extraction layer between the light-emitting device and the packaging structure, and a refractive index of the light extraction layer is greater than the refractive index of the first inorganic packaging sublayer, and a difference between the refractive index of the light extraction layer and the refractive index of the first inorganic packaging sublayer is greater than 0.2.

2. The display panel of claim 1, wherein the packaging structure further comprises an organic packaging layer and a second inorganic packaging layer that are stacked, and the organic packaging layer is between the first inorganic packaging layer and the second inorganic packaging layer.

3. The display panel of claim 2, wherein the first inorganic packaging layer further comprises a fourth inorganic packaging sublayer, the fourth inorganic packaging sublayer is between the third inorganic packaging sublayer and the organic packaging layer; and
   the refractive index of the third inorganic packaging sublayer is greater than a refractive index of the fourth inorganic packaging sublayer, and a difference between the refractive index of the third inorganic packaging sublayer and the refractive index of the fourth inorganic packaging sublayer is greater than 0.1, the refractive index of the fourth inorganic packaging sublayer is greater than a refractive index of the organic packaging layer, and a difference between the refractive index of the fourth inorganic packaging sublayer and the refractive index of the organic packaging layer is greater than 0.1.

4. The display panel of claim 1, wherein the difference between the refractive index of the second inorganic packaging sublayer and the refractive index of the first inorganic packaging sublayer is greater than 0.6 and less than 1.5, and the difference between the refractive index of the second inorganic packaging sublayer and the refractive index of the third inorganic packaging sublayer is greater than 0.3 and less than 1.5.

5. The display panel of claim 1, wherein the difference between the refractive index of the second inorganic packaging sublayer and the refractive index of the first inorganic packaging sublayer is greater than 0.9, and the difference between the refractive index of the second inorganic packaging sublayer and the refractive index of the third inorganic packaging sublayer is greater than 0.6.

6. The display panel of claim 1, wherein the difference between the refractive index of the second inorganic packaging sublayer and the refractive index of the first inorganic packaging sublayer is greater than the difference between the refractive index of the second inorganic packaging sublayer and the refractive index of the third inorganic packaging sublayer.

7. The display panel of claim 1, wherein a thickness of the third inorganic packaging sublayer is greater than 25 times a thickness of the first inorganic packaging sublayer and greater than 25 times a thickness of the second inorganic packaging sublayer.

8. The display panel of claim 1, wherein the first inorganic packaging sublayer has a refractive index of 1-1.6 and a thickness of 40-200 nm;
   the second inorganic packaging sublayer has a refractive index of 1.6-2.5, and a thickness of 40-300 nm;
   the third inorganic packaging sublayer has a refractive index of 1-2.2, and a thickness greater than or equal to 1000 nm; and
   materials forming the first inorganic packaging sublayer, the second inorganic packaging sublayer and the third inorganic packaging sublayer are independently selected from $SiO_2$, SiN, silicon oxynitride, $Al_2O_3$ or ZrO.

9. The display panel of claim 1, wherein the display panel further comprises a light extraction layer between the light-emitting device and the packaging structure, and a refractive index of the light extraction layer is greater than the refractive index of the first inorganic packaging sublayer, and a difference between the refractive index of the light extraction layer and the refractive index of the first inorganic packaging sublayer is greater than 0.2.

10. The display panel of claim 9, wherein the difference between the refractive index of the light extraction layer and the refractive index of the first inorganic packaging sublayer is greater than 0.8.

11. The display panel of claim 9, wherein the light extraction layer is on a side of the cathode away from the light emitting layer; the refractive index of the light extraction layer is greater than 1.8, and a thickness of the light extraction layer is less than 150nm.

12. A display device comprising the display panel of claim 1.

* * * * *